United States Patent
Wang

(10) Patent No.: US 10,211,229 B2
(45) Date of Patent: Feb. 19, 2019

(54) POLYSILICON THIN FILM TRANSISTOR AND MANUFACTURING METHOD THEREOF, ARRAY SUBSTRATE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Zuqiang Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 127 days.

(21) Appl. No.: 15/340,524

(22) Filed: Nov. 1, 2016

(65) Prior Publication Data

US 2017/0047352 A1 Feb. 16, 2017

Related U.S. Application Data

(62) Division of application No. 14/345,344, filed as application No. PCT/CN2013/086882 on Nov. 11, 2013, now Pat. No. 9,530,799.

(30) Foreign Application Priority Data

Mar. 5, 2013 (CN) .......................... 2013 1 0068300

(51) Int. Cl.
*H01L 29/786* (2006.01)
*H01L 27/12* (2006.01)
(Continued)

(52) U.S. Cl.
CPC .... *H01L 27/1222* (2013.01); *H01L 21/02532* (2013.01); *H01L 21/02595* (2013.01);
(Continued)

(58) Field of Classification Search
CPC ........... H01L 27/1222; H01L 29/66757; H01L 21/324; H01L 21/02532; H01L 27/127;
(Continued)

(56) References Cited

U.S. PATENT DOCUMENTS

| | | |
|---|---|---|
| 5,405,791 A | 4/1995 | Ahmad et al. |
| 5,683,927 A | 11/1997 | Dennison et al. |

(Continued)

FOREIGN PATENT DOCUMENTS

| | | |
|---|---|---|
| CN | 1397995 A | 2/2003 |
| CN | 1427479 A | 7/2003 |

(Continued)

OTHER PUBLICATIONS

International Search Report dated Jan. 22, 2014; PCT/CN2013/086882.

(Continued)

*Primary Examiner* — Cuong B Nguyen
*Assistant Examiner* — Samuel Park
(74) *Attorney, Agent, or Firm* — Ladas & Parry LLP; Loren K. Thompson

(57) ABSTRACT

A polysilicon thin film transistor, a manufacturing method thereof, an array substrate involve display technology field, and can repair the boundary defect and the defect state in polysilicon, suppress the hot carrier effect and make the characteristics of TFTs more stable. The polysilicon thin film transistor includes a gate electrode, a source electrode, a drain electrode and an active layer, the active layer comprises at least a channel area, first doped regions, second doped regions and heavily doped regions, and the first doped (Continued)

regions are disposed on two sides of the channel area, the second doped regions are disposed on sides of the first doped regions away from the channel area; the heavily doped regions are disposed on sides of the second doped regions opposed to the first doped regions; and dosage of ions in the heavily doped regions lies between that in the first doped regions and that in the second doped regions.

10 Claims, 8 Drawing Sheets

(51) Int. Cl.
 *H01L 21/02* (2006.01)
 *H01L 21/265* (2006.01)
 *H01L 21/324* (2006.01)
 *H01L 29/66* (2006.01)

(52) U.S. Cl.
 CPC ...... *H01L 21/26513* (2013.01); *H01L 21/324* (2013.01); *H01L 27/127* (2013.01); *H01L 29/66757* (2013.01); *H01L 29/78621* (2013.01); *H01L 29/78675* (2013.01); *H01L 2029/7863* (2013.01)

(58) Field of Classification Search
 CPC ......... H01L 21/02595; H01L 21/26513; H01L 29/78675; H01L 29/78621; H01L 2029/7863
 See application file for complete search history.

(56) References Cited

U.S. PATENT DOCUMENTS

| | | | |
|---|---|---|---|
| 5,885,886 A * | 3/1999 | Lee | H01L 21/26506 257/E21.335 |
| 5,910,672 A * | 6/1999 | Iwamatsu | H01L 21/26506 257/219 |
| 5,996,274 A | 12/1999 | Akram et al. | |
| 6,211,027 B1 | 4/2001 | Lin et al. | |
| 6,646,287 B1 | 11/2003 | Ono et al. | |
| 6,660,605 B1 * | 12/2003 | Liu | H01L 29/7833 257/E21.345 |
| 2002/0031883 A1 | 3/2002 | Sayama | |
| 2002/0105033 A1 * | 8/2002 | Zhang | H01L 27/1214 257/353 |
| 2002/0192889 A1 | 12/2002 | Akram et al. | |
| 2003/0089910 A1 | 5/2003 | Inukai | |
| 2006/0091398 A1 | 5/2006 | Yamaguchi et al. | |
| 2006/0216874 A1 | 9/2006 | Cheng | |
| 2006/0270124 A1 * | 11/2006 | You | H01L 27/1214 438/151 |
| 2010/0051948 A1 | 3/2010 | Kawata | |
| 2012/0319102 A1 * | 12/2012 | Yamazaki | H01L 29/7869 257/43 |

FOREIGN PATENT DOCUMENTS

| | | |
|---|---|---|
| CN | 1779929 A | 5/2006 |
| CN | 1790748 A | 6/2006 |
| CN | 103151388 A | 6/2013 |

OTHER PUBLICATIONS

First Chinese Office Action dated Feb. 2, 2015; Appln. No. 201310068300.9.
Second Chinese Office Action dated Aug. 5, 2015; Appln. No. 201310068300.9.
International Preliminary Report on Patentability dated Sep. 8, 2015; PCT/CN2013/086882.
USPTO RR dated Aug. 13, 2015 in connection with U.S. Appl. No. 14/345,344.
USPTO NFOA dated Jan. 15, 2016 in connection with U.S. Appl. No. 14/345,344.
USPTO NOA dated Aug. 26, 2016 in connection with U.S. Appl. No. 14/345,344.
USPTO Corrected NOA dated Sep. 20, 2016 in connection with U.S. Appl. No. 14/345,344.

* cited by examiner

US 10,211,229 B2

POLYSILICON THIN FILM TRANSISTOR AND MANUFACTURING METHOD THEREOF, ARRAY SUBSTRATE

TECHNICAL FIELD

Embodiments of the present invention relate to a polysilicon thin film transistor and a manufacturing method thereof, an array substrate.

BACKGROUND

A liquid crystal display with low-temperature polysilicon thin film transistors (LTPS-TFTs) has merits of high resolution, fast response speed, high luminance, high aperture ratio, etc. Due to the characteristics of LTPS, LTPS-TFTs have high electron mobility. In addition, a peripheral drive circuit can also be produced on a glass substrate of the LCD together with a pixel array, so as to achieve goals of system integration, space saving and cost reduction for a drive IC, and this may decrease yield of products as well.

With the development trend toward miniaturization, an LTPS-TFT has become more and more small gradually. However, because the power supply voltage and the working voltage of the LTPS-TFT are not reduced to a great degree correspondingly, the electric field intensity in operation is increased consequently, which leads to increasing of motion rate of electrons. In this case, when the energy of electrons is high enough, the electrons will leave a substrate and tunnel into a gate oxide layer, which phenomenon is called as a hot carrier effect. This effect will cause the threshold voltage of an N-type metal oxide semiconductor (NMOS) to increase, or the threshold voltage of P-type metal oxide semiconductor (PMOS) to decrease, thus affecting characteristic parameters of a MOS, such as threshold voltage (VT), transconductance (gm), sub-threshold slope (St), saturation current ($I_{dsat}$), etc. This results in degradation of characteristics of an MOS, and brings about a long-term reliability problem.

In a fabrication process of a traditional LTPS-TFT array substrate, heavy doping on a polysilicon layer is included, namely, an ion implantation is conducted so as to form source and drain regions (SD). Owing to a higher doping concentration, source and drain regions are very close to a gate electrode, and it will produce a strong electric field in the vicinity of source and drain regions and result in the hot carrier effect. When TFTs are turned off, leakage current (off-state current) is overlarge, so that the performance of TFTs is very unstable.

At present, in order to decrease a leakage current, it is usually required that a light doping process be conducted on the drain region, so as to reduce the leakage current by way of decreasing the electric field at the boundary of the drain electrode. For example, one fabrication method comprises the following steps.

Step S101, as illustrated in FIG. 1, a polysilicon layer is formed on a substrate 10, and then it is formed to be an active layer through one patterning process, and the active layer comprises a channel area 200 and first patterns 201 located on two sides of the channel area, as well as third patterns 203 located on the sides of the first patterns 201 away from the channel area 200.

S102, as illustrated in FIG. 2, a gate insulating layer 30 is formed on the substrate 10, and a first photoresist pattern 401 corresponding to the channel area 200 and the first patterns 201 is formed.

S103, as illustrated in FIG. 3, a first ion implantation process is conducted to form heavily doped regions 2031 at the location of the third patterns 203, and then the first photoresist pattern 401 is removed.

S104, as illustrated in FIG. 4, after completion of the above steps, a gate electrode 50 positioned over the channel area 200 is formed, and a second ion implantation process is conducted, so as to form lightly doped regions 2011 at the location of the first patterns 201.

S105, as illustrated in FIG. 5, on the substrate subjected to the above steps, a protection layer 60, a source electrode 701 and a drain electrode 702, and a pixel electrode 801 electrically connected to the drain electrode 702 are formed.

Although the leakage current can be suppressed to a certain extent by the above method, it still has such problems that the effect is not good enough, the boundary defect is high, and so on.

SUMMARY

According to embodiments of the present invention, there are provided a polysilicon thin film transistor and manufacturing method thereof, an array substrate, whereby the boundary defect and the defect state in polysilicon can be repaired, and the hot carrier effect can be suppressed so that the performance of TFTs is more stable.

In an aspect of the invention, there is provided a polysilicon thin film transistor, comprising a gate electrode, a source electrode, a drain electrode and an active layer that comprises at least a channel area, first doped regions, second doped regions and heavily doped regions, and the first doped regions are disposed on two sides of the channel area, the second doped regions are disposed on sides of the first doped regions away from the channel area; the heavily doped regions are disposed on sides of the second doped regions opposed to the first doped regions; and a dosage of ions in the heavily doped regions lies between that in the first doped regions and that in the second doped regions.

In another aspect of the invention, there is provided an array substrate, comprising the above polysilicon thin film transistor.

In still another aspect of the invention, there is provided a manufacturing method of a polysilicon thin film transistor, comprising: forming a gate electrode, a source electrode, a drain electrode and an active layer on a substrate, the active layer comprises at least a channel area, first patterns located on two sides of the channel area, second patterns located on sides of the first patterns away from the channel area, and third patterns located on the sides of the second patterns away from the first patterns; forming heavily doped regions at the location of the third patterns, passivated doped regions or lightly doped regions at the location of the second patterns, and the lightly doped regions or the passivated doped regions at the location of the first patterns, by a doping process; the first patterns and the second patterns are one kind of the passivated doped regions and the lightly doped regions respectively; doping ions for passivation that form stable covalent bonds with silicon atoms are included in the passivated doped regions, and an implantation depth of the doping ions for passivation in the passivated doped regions is smaller than an implantation depth of ions in the heavily doped regions and the lightly doped regions, and a dosage thereof is greater than a dosage of ions in the heavily doped regions.

Where the first doped regions or the second doped regions are passivated doped regions, and doping ions for passivation that form stable covalent bonds with silicon atoms are included in the passivated doped regions; on one hand, the doping ions for passivation in the passivated doped regions is adaptable to repair boundary defects and defect states in polysilicon; on the other hand, after diffusion of doping ions for passivation of high concentration, the diffusion rate of ions in other two regions can be restrained. Thereby, the hot carrier effect is effectively suppressed, and in turn, this causes the performance of TFTs to be more stable.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE NUMERALS

10—substrate; 20—polysilicon layer; 21—active layer; 200—channel area, 201—first pattern, 202—second pattern, 203—third pattern; 2011—lightly doped region, 2031—heavily doped region, 2021—passivated doped region; 201a—first doped region, 202a—second doped region; 30—gate insulating layer; 40—photoresist, 401—first photoresist pattern, 402—second photoresist pattern; 50—gate electrode; 60—protection layer; 701—source electrode, 702—drain electrode; 801—pixel electrode; 802—common electrode; 90—buffer layer.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention.

Unless otherwise defined, the technical or scientific ten is used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term "a," "an," or "the" does not indicate limitation in number, but specifies the presence of at least one. A term "comprises," "comprising," "includes," "including", "contains" or the like means that an element or article ahead of this term encompasses element(s) or article(s) listed behind this term and its(their) equivalents, but does not preclude the presence of other elements or articles. A term "connection," "connected," or the like is not limited to physical or mechanical connection, but can include electrical connection, whether directly or indirectly. "On," "under," "left," "right" or the like is only used to describe a relative positional relationship, and when the absolute position of a described object is changed, the relative positional relationship might also be changed accordingly.

Figure 1:
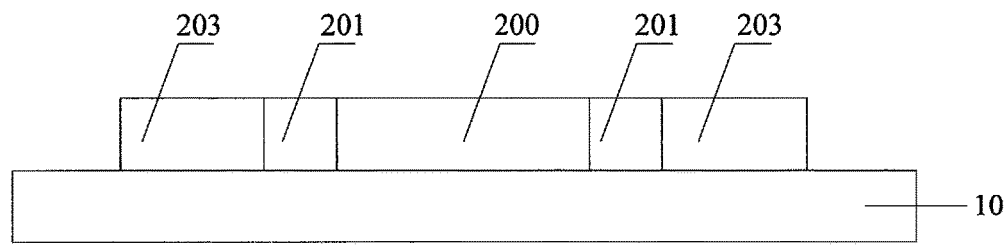
FIG. 1 to FIG. 5 are first to fifth schematic views illustrating the manufacture of an array substrate provided by a traditional technology.
Figure 2:
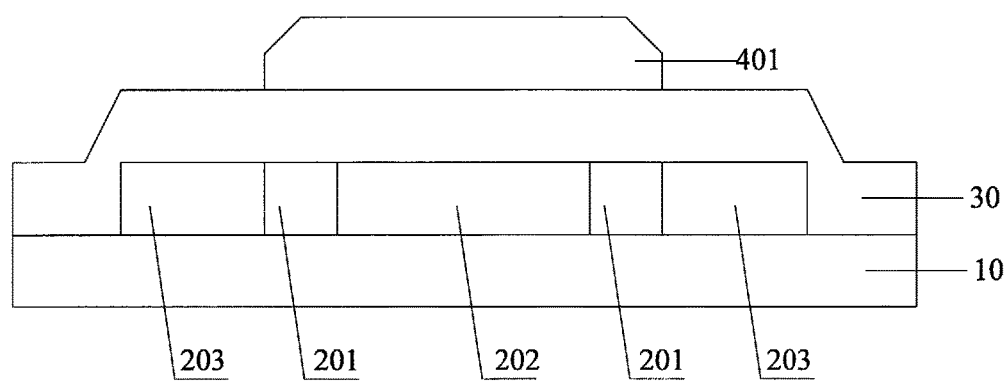
Figure 3:
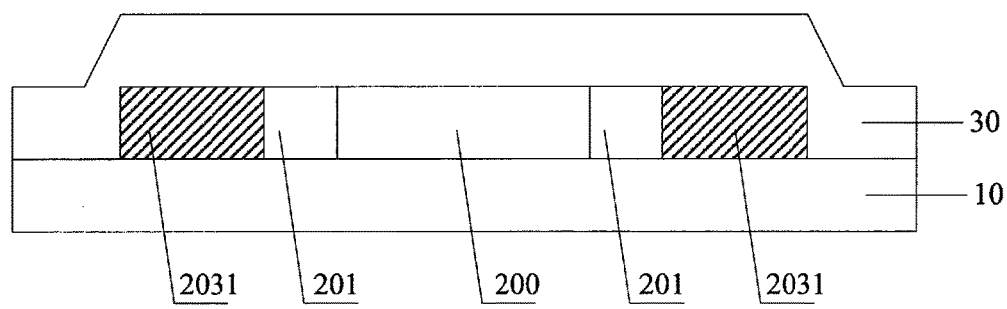
Figure 4:
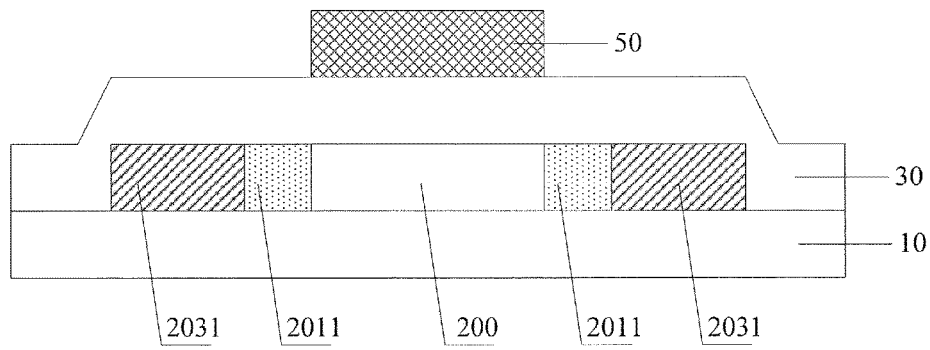
Figure 5:
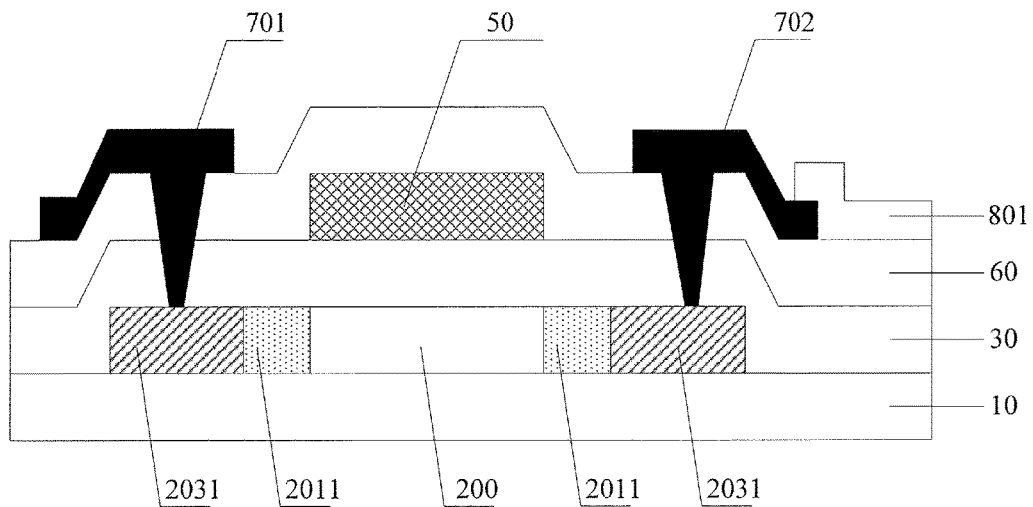
Figure 6:
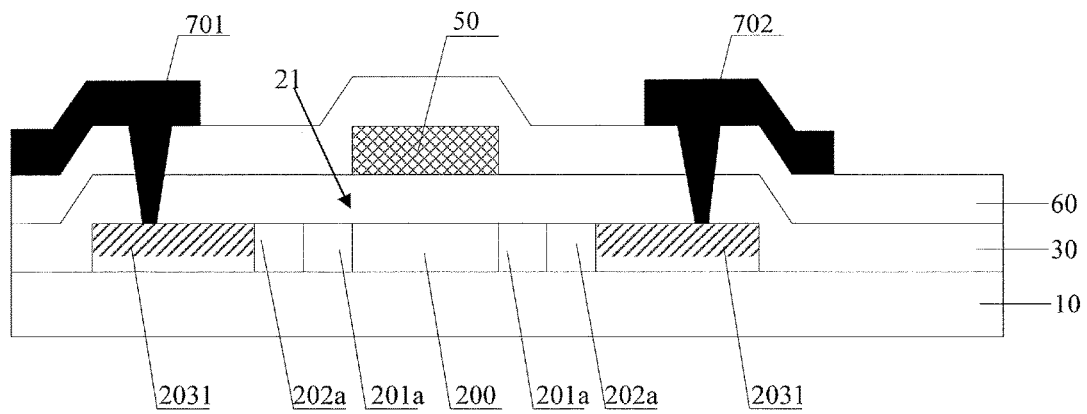
FIG. 6 is a structurally schematic view illustrating a polysilicon thin film transistor provided by an embodiment of the invention.

According to an embodiment of the invention, there is provided a polysilicon thin film transistor, which comprises a gate electrode 50, a source electrode 701, a drain electrode 702, a gate insulating layer 30, a protection layer 60 and an active layer 21, as illustrated in FIG. 6. The active layer 21 comprises at least a channel area 200, first doped regions 201a, second doped regions 202a and heavily doped regions 2031. The channel area 200 serves to provide a channel for carriers when the polysilicon thin film transistor operates.

The first doped regions 201a are disposed on two sides of the channel area 200, the second doped regions 202a are disposed on two sides of the channel area 200 as well and located on the sides of the first doped regions 201a away from the channel area 200, so that the first doped regions 201a are interposed between the channel area 200 and the second doped regions 202a. The heavily doped regions 2031 are also disposed on two sides of the channel area 200 and located on the sides of the second doped regions 202a away from the first doped regions 201a, so that the second doped regions 202a lie between the heavily doped regions 2031 and the first doped regions 201a. The dosage of implanted ions in the heavily doped regions 2031 lies between the dosage of implanted ions in the first doped regions 201a and the dosage of implanted ions in the second doped regions 202a.

As for the polysilicon TFT illustrated in FIG. 6, in order to decrease a leakage current, it comprises lightly doped regions. In the polysilicon TFT in the embodiment, one of the first doped region 201a and the second doped region 202a on each side as stated above may be a lightly doped region.

In addition, the heavily doped regions 2031 may be P-type heavily doped regions, or N-type heavily doped regions. In the case of P type, the ions implanted in the heavily doped regions 2031 may be such as boron ions, and in the case of N type, the ions implanted in the heavily doped regions 2031 may be such as phosphorus ions.

According to an embodiment of the invention, there is provided a polysilicon thin film transistor, which comprises a gate electrode 50, a source electrode 701, a drain electrode 702 and an active layer 21. The active layer 21 comprises at least a channel area 200, first doped regions 201a, second doped regions 202a and heavily doped regions 2031. The first doped regions 201a are disposed on two sides of the channel area 200, the second doped regions 202a are disposed on two sides of the channel area 200 and located on the sides of the first doped regions 201a away from the channel area 200: the heavily doped regions 2031 are disposed on two sides of the channel area 200 and located on the sides of the second doped regions 202a away from the first doped regions 201a. The dosage of implanted ions in the heavily doped regions 2031 lies between the dosage of implanted ions in the first doped regions 201a and the dosage of implanted ions in the second doped regions 202a.

The first doped regions 201a or the second doped regions 202a are passivated doped regions, and the passivated doped regions comprise doping ions for passivation that form stable covalent bonds with silicon atoms. In this case, on one hand, the doping ions for passivation in the passivated doped regions are adaptable to repair boundary defects and defect states in polysilicon; on the other hand, after the diffusion of doped ions for passivation at a high concentration, the diffusion rate of ions in other two regions can be suppressed. Thereby, hot carrier effect is effectively suppressed. In turn, this causes TFTs to present a more stable performance.

Figure 7:
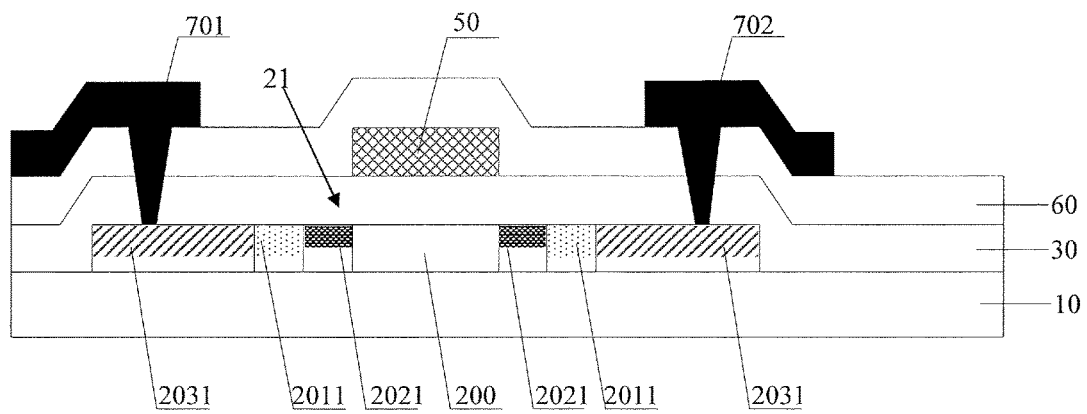
FIG. 7 is a structurally schematic view illustrating another polysilicon thin film transistor provided by an embodiment of the invention.

In one example, as illustrated in FIG. 7, the first doped regions 201a are passivated doped regions 2021, and the second doped regions 202a are lightly doped regions 2011. The depth of ions in the passivated doped regions 2021 is smaller than the implantation depth of ions in the heavily doped regions 2031 and the lightly doped regions 2011, while the implantation dosage of the ions is greater than dosage of the implanted ions in the heavily doped regions 2031.

The passivated doped regions 2021 include doping ions for passivation that form stable covalent bonds with silicon atoms, such as nitrogen ions ($N^+$) or nitrogen gas ions ($N_2^+$). These ions can form Si—N bonds together with Si atoms, so as to repair boundary defects and defect states in polysilicon.

It is to be noted that, the so-called "implantation depth" here refers to the travel distance into a doped layer with a top surface of a doped pattern (the doped layer) as a reference; the so-called "top surface" is defined relative to an underlying substrate, namely, with reference to the substrate, one surface of the pattern that is away from the substrate is a top surface, and another opposed surface that is close to the substrate is a bottom surface.

In addition, the concentration of doping ions of the lightly doped regions 2011 is smaller than the concentration of doping ions of the heavily doped regions 2031.

Figure 8:
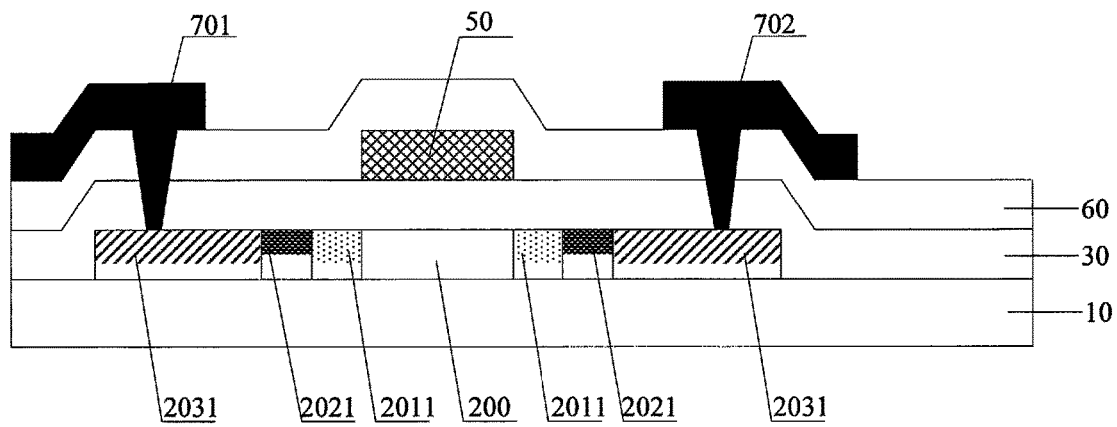
FIG. 8 is a structurally schematic view illustrating still another polysilicon thin film transistor provided by an embodiment of the invention.

In another example, as illustrated in FIG. 8, the first doped regions 201a are lightly doped regions 2011, the second doped regions 202a are passivated doped regions 2021; the implantation depth of ions in the passivated doped regions 2021 is smaller than the depth of ions in the heavily doped regions 2031 and the lightly doped regions 2011, while the implantation dosage of the ions is greater than dosage of the implanted ions in the heavily doped regions 2031.

The implantation depth of doping ions for passivation in the passivated doped regions 2021 is smaller than the implantation depth of ions in the heavily doped regions 2031 and the lightly doped regions 2011, which can suppress ions (such as boron ions or phosphorus ions) in these two regions from diffusing along the direction of the gate insulating layer and leaving, which causes TFTs to present a more stable performance.

According to an embodiment of the invention, there is provided a polysilicon thin film transistor, which comprises a gate electrode 50, a source electrode 701, a drain electrode 702 and an active layer. The active layer comprises at least a channel area 200, first doped regions 201a, second doped regions 202a and heavily doped regions 2031. The first doped regions 201a are disposed on two sides of the channel area 200, the second doped regions 202a are disposed on two sides of the channel area 200 and located on the sides of the first doped regions 201a away from the channel area 200; the heavily doped regions 2031 are disposed on two sides of the channel area 200 and located on the sides of the second doped regions 202a away from the first doped regions 201a. The dosage of implanted ions in the heavily doped regions 2031 lies between the dosage of implanted ions in the first doped regions 201a and the dosage of implanted ions in the second doped regions 202a.

Where the first doped regions 201a and the second doped regions 202a are passivated doped regions 2021 and lightly doped regions 2011, respectively, and the passivated doped regions 2021 comprise doping ions for passivation that form stable covalent bonds with silicon atoms; on one hand, the doping ions for passivation in the passivated doped regions 2021 are adaptable to repair boundary defects and defect states in polysilicon; on the other hand, after the doped ions for passivation at a high concentration diffuse, the diffusion rate of ions in other two regions can be suppressed. Thereby, hot carrier effect is effectively suppressed. In turn, this causes TFTs to present a more stable performance. Furthermore, because the implantation depth of doping ions for passivation in the passivated doped regions 2021 is smaller than the implantation depth of ions in the heavily doped regions 2031 and the lightly doped regions 2011, ions (such as boron ions or phosphorus ions) in these two regions can be suppressed from diffusing toward the direction of a gate insulating layer and leaving, which causes TFTs to present a more stable performance.

According to an embodiment of the invention, there is provided an array substrate, comprising the above polysilicon thin film transistor and a pixel electrode 801, as illustrated in FIG. 9 to FIG. 12.

The array substrate according to the embodiment of the invention comprises for example a plurality of gate lines and a plurality of data lines, which cross over each other to thereby define pixel units arranged in the form of a matrix, and each of the pixel units comprises a thin film transistor functioning as a switch element and a pixel electrode used to control arrangement of liquid crystals. For example, for the thin film transistor of each pixel, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. On the basis of type of the array substrate, each pixel unit may further include a common electrode, which acts to form a liquid crystal capacitor together with the pixel electrode for driving liquid crystals to deflect; the common electrode and the pixel electrode may be formed on different layers or formed on the same layer.

Figure 10:
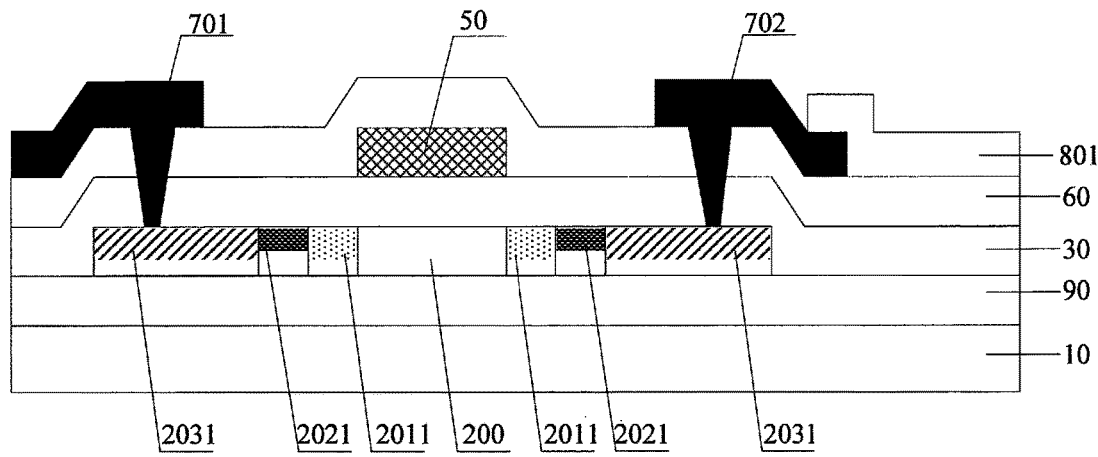
FIG. 10 is a structurally schematic view illustrating another array substrate provided by an embodiment of the invention.

For example, as illustrated in FIG. 10, in order to prevent harmful substances (such as alkali metal ions) in a base substrate (such as a glass substrate) employed for the array substrate from adversely affecting the properties of the polysilicon layer, a buffer layer 90 may be formed on the substrate 10 firstly. The buffer layer 90 may be of silicon nitride, silicon oxynitride, or other material.

Figure 11:
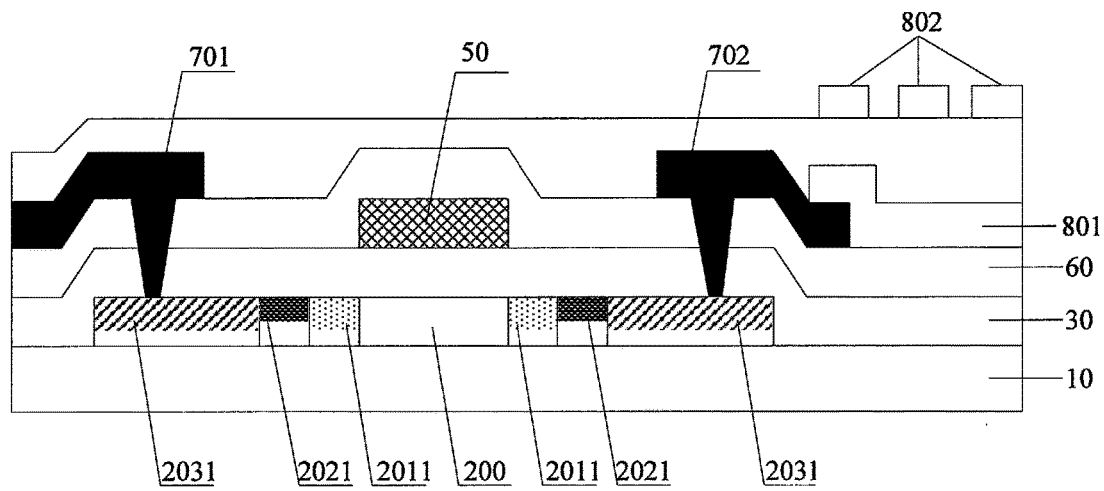
FIG. 11 is a structurally schematic view illustrating still another array substrate provided by an embodiment of the invention.
Figure 12:
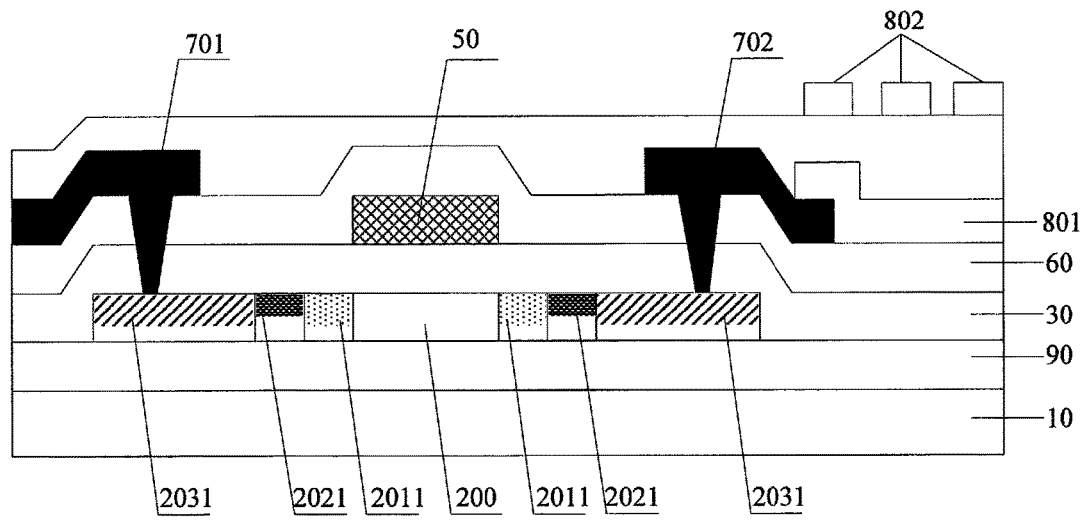
FIG. 12 is a structurally schematic view illustrating yet still another array substrate provided by an embodiment of the invention.

The array substrate provided by an embodiment of the invention can be applied to liquid crystal display devices of ADS, IPS, TN and other types. Therefore, as illustrated in FIG. 11 or FIG. 12, the array substrate may further include a common electrode 802 if it is applied to LCDs of ADS and IPS modes; while as for a TN mode LCD, a common electrode is formed on a counter substrate (such as a color filter substrate) disposed in opposition to the array substrate.

According to an embodiment of the invention, there is provided an array substrate, comprising the above polysilicon thin film transistor. Where the first doped regions 201a or the second doped regions 202a are passivated doped regions, and the passivated doped regions comprise doping ions for passivation that form stable covalent bonds with silicon atoms, on one hand, the doping ions for passivation in the passivated doped regions 2021 are adaptable to repair boundary defects and defect states in polysilicon; on the other hand, after the doped ions for passivation at a high concentration diffuse, the diffusion rate of ions in other two regions can be suppressed. Thereby, the hot carrier effect is effectively suppressed. In turn, this causes TFTs to present a more stable performance.

According to an embodiment of the invention, there is provided a manufacturing method of a polysilicon thin film transistor, which comprises formation of a gate electrode 50, a source electrode 701, a drain electrode 702 and an active layer on a substrate, and the active layer comprises at least a channel area 200, first patterns 201 located on two sides of the channel area, second patterns 202 located on the sides of the first patterns away from the channel area, and third patterns 203 located on the sides of the second patterns away from the first patterns.

By a doping process, heavily doped regions 2031 are formed at the location of the third patterns 203, passivated doped regions 2021 or lightly doped regions 2011 are formed at the location of the second patterns 202, and accordingly, the lightly doped regions 2011 or the passivated doped regions 2021 are formed at the location of the first patterns 201. The first patterns 201 and the second patterns 202 are for one kind of the passivated doped regions 2021 and the lightly doped regions 2011 respectively. Doping ions for passivation that form stable covalent bonds with silicon atoms are included in the passivated doped regions 2021, and the implantation depth of the doping ions for passivation in the passivated doped regions 2021 is smaller than the implantation depth of ions in the heavily doped regions and the lightly doped regions, and the implantation dosage of the ions is greater than the implantation dosage of the ions in the heavily doped regions.

It is to be noted that, firstly, the first patterns 201 and the second patterns 202 being one kind of the passivated doped regions 2021 and the lightly doped regions 2011 respectively means that, where at the location of the first patterns 201 are the passivated doped regions 2021, at the location of the second patterns 202 are the lightly doped regions 2011; and where at the location of the first patterns 201 are the lightly doped regions 2011, at the location of the second patterns are the passivated doped regions 2021.

Secondly, the heavily doped regions 2031 may be P-type heavily doped regions, or N-type heavily doped regions. In the case of P type, the implanted ions may be such as boron ions, and in the case of N type, the implanted ions may be such as phosphorus ions.

Thirdly, Doping ions for passivation that can form stable covalent bonds with silicon atoms are, such as nitrogen ions ($N^+$) or nitrogen gas ions ($N_2^+$), and they can form Si—N bonds together with Si.

Fourth, the so-called "implantation depth" refers to the travel distance into a doped layer with a top surface of a doped pattern (the doped layer) as a reference; the so-called "top surface" is defined relative to an underlying substrate, namely, with reference to the substrate, one surface of the pattern that is away from the substrate is a top surface, and another opposed surface that is close to the substrate is a bottom surface.

Fifth, the ion concentration of the lightly doped regions 2011 is smaller than the ion concentration of the heavily doped regions 2031.

According to an embodiment of the invention, there is provided a manufacturing method of an array substrate, which comprises forming a gate electrode 50, a source electrode 701, a drain electrode 702 and an active layer on a substrate, and the active layer comprises at least a channel area 200, first patterns 201 located on two sides of the channel area, second patterns 202 located on the sides of the first patterns away from the channel area, and third patterns 203 located on the sides of the second patterns away from the first patterns; by a doping process, forming heavily doped regions 2031 at the location of the third patterns 203, passivated doped regions 2021 or lightly doped regions 2011 at the location of the second patterns 202, and the lightly doped regions 2011 or the passivated doped regions 2021 at the location of the first patterns 201. The implantation depth of the doping ions for passivation in the passivated doped regions 2021 is smaller than the implantation depth of ions in the heavily doped regions 2031 and the lightly doped regions 2011, and the dosage thereof is greater than dosage of ions in the heavily doped regions 2031.

On one hand, as the doping ions for passivation that can form stable covalent bonds with silicon atoms are included in the passivated doped regions 2021, boundary defects and defect states in polysilicon can be repaired; on the other hand, after the doped ions for passivation at a high concentration diffuse, the diffusion rate of ions in the heavily doped regions 2031 and the lightly doped regions 2011 can be restrained. Thereby, the hot carrier effect is effectively suppressed. In turn, this causes TFTs to present a more stable performance. Furthermore, because the implantation depth of doping ions for passivation in the passivated doped regions 2021 is smaller than the implantation depth of ions in the heavily doped regions 2031 and the lightly doped regions 2011s, ions (such as boron ions or phosphorus ions) in these two regions can be suppressed from diffusing toward the direction of a gate insulating layer and leaving.

An active layer is forming on the substrate, and the active layer comprises a channel area 200, first patterns 201 located on two sides of the channel area, second patterns 202 located on the sides of the first patterns away from the channel area, and third patterns 203 located on the sides of the second patterns away from the first patterns. One example of the step comprises: a polysilicon layer is formed on a substrate and is subjected to one patterning process so as to form the channel area 200, the first patterns 201 located on two sides of the channel area, the second patterns 202 located on the sides of the first patterns away from the channel area, and the third patterns 203 located on the sides of the second patterns away from the first patterns.

Exemplarily, formation of the polysilicon layer on the substrate may be the case in which an amorphous silicon layer is deposited on a substrate by way of plasma enhanced chemical vapor deposition (PECVD), and then a dehydrogenation process is conducted on the amorphous silicon layer with a high-temperature oven so as to prevent a hydrogen decrepitation phenomenon from occurring during crystallization and to decrease the defect-state density inside the thin film after crystallization. After completion of the dehydrogenation process, a process of forming a low-temperature polysilicon is performed, and it is possible that crystallizing processes such as a laser annealing (ELA)

process, a metal induced crystallization (MIC) process, a solid-phase crystallization (SPC) process or the like is employed to conduct a crystallization treatment so as to form a polysilicon layer on the substrate.

Currently, the doping process comprises two manners, i.e., an ion implantation process and a diffusion process. For example, the ion implantation has merits: various kinds of impurities are doped into semiconductors at lower temperatures, the concentration distribution of the doped ions can be controlled precisely, homogeneous doping in a large scale can be realized, and so on. Thus, in the embodiment, the doping process is preferably an ion implantation process.

On the basis of the above, further, an example of the method may include the following steps:

Step 1, an active layer is formed on a substrate, the active layer including a channel area 200, first patterns 201 located on two sides of the channel area, second patterns 202 located on the sides of the first patterns away from the channel area, and third patterns 203 located on the sides of the second patterns away from the first patterns.

Step 2, a gate insulating layer 30 is formed on the basis of the forgoing step, and a first photoresist pattern 401 exactly corresponding to the channel area 200, the first patterns 201, and the second patterns 202 is formed on the gate insulating layer.

Here, the first photoresist pattern 401 exactly corresponding to the channel area 200, the first patterns 201, and the second patterns 202 means that, the first photoresist pattern 401 fully covers the channel area 200, the first patterns 201, and the second patterns 202 exactly. Furthermore, the thickness of a gate insulating layer 30 may affect the amount of energy necessary for the subsequent implantation of ions, and therefore, the thickness of the gate insulating layer 30 is usually in the range of 800 Å to 1000 Å here.

Step 3, through one ion implantation process, heavily doped regions 2031 are formed at the location of the second patterns 203.

Here, a first ion implantation process is performed with the first photoresist pattern 401 as a mask. The heavily doped regions 2031 are of P type, and they may also be of N type. In the case of P type, the implanted ions may be boron ions for example, and in the case of N type, the implanted ions may be phosphorus ions for example. Furthermore, the first ion implantation process can elect an acceleration voltage in the range of 10-50 KeV and the dosage of the implanted in the range of $1E14$-$5E15/cm^3$.

Step 4, after the photoresist at the location of the first photoresist pattern 401 is removed, a metal layer and a layer of photoresist are formed on the substrate in sequence, and after the photoresist is subjected to exposure and development and the metal layer is etched, the gate electrode 50 and a second photoresist pattern 402 provided on the gate electrode 50 are formed, and the second photoresist pattern 402 exactly corresponds to the channel area 200 and the first patterns 201.

Here, similarly, the second photoresist pattern 402 exactly corresponding to the channel area 200 and the first patterns 201 means that, the second photoresist pattern 402 fully covers the channel area 200 and the first patterns 201 exactly. In addition, the etch method used here is a wet etching, namely, after etching, the gap between an edge of the gate electrode 50 and an edge of the second photoresist pattern 402 exactly corresponds to a first pattern 201.

Step 5, by one ion implantation process, passivated doped regions 2021 or lightly doped regions 2011 are formed at the location of the second patterns 202; doping ions for passivation that form stable covalent bonds with silicon atoms are included in the passivated doped regions 2021. Moreover, the implantation depth of the doping ions for passivation in the passivated doped regions 2021 is smaller than the implantation depth of ions in the heavily doped regions 2031, and the implantation dosage of the ions is greater than the dosage of the implanted ions in the heavily doped regions 2031.

Here, a second ion implantation process is performed with the second photoresist pattern 402 as a mask. If passivated doped regions 2021 are formed at the location of the second patterns 202 after the second ion implantation, then the second ion implantation process can elect an acceleration voltage in the range of 10-50 KeV and the implantation dosage in the range of $1E14$-$5E15/cm^3$; and if lightly doped regions 2011 are formed at the location of the second patterns 202 after the second ion implantation process, then the second ion implantation process can elect the acceleration voltage in the range of 10-50 KeV and the implantation dosage in the range of $1E14$-$5E15/cm^3$.

In addition, doping ions for passivation that can form stable covalent bonds with silicon atoms are for example nitrogen ions ($N^+$) or nitrogen gas ions ($N_2^+$). On one hand, nitrogen ions ($N^+$) or nitrogen gas ions ($N_2^+$) can form Si—N bonds with Si atoms, so that boundary defects and defect states in polysilicon are repaired; on the other hand, after the doped ions for passivation at a high concentration diffuse, the diffusion rate of ions in the heavily doped regions and the lightly doped regions can be restrained. Thereby, the hot carrier effect is effectively suppressed. In turn, this causes TFTs to present a more stable performance. Because the implantation depth of doping ions for passivation in the passivated doped regions is smaller than the implantation depth of ions in the heavily doped regions and the lightly doped regions, ions (such as boron ions or phosphorus ions) in these regions can be suppressed from diffusing toward the direction of a gate insulating layer and leaving.

Step 6, after the photoresist at the location of the second photoresist pattern 402 is removed, by one ion implantation process, lightly doped regions 2011 or passivated doped regions 2021 are formed at the location of the first patterns 201. The first patterns 201 and the second patterns 202 are one kind of the passivated doped regions 2021 and the lightly doped regions 2011 respectively, and the implantation depth of ions in the lightly doped regions 2011 is greater than the implantation depth of the doping ions for passivation in the passivated doped regions 2021.

Here, a third ion implantation process is performed with the gate electrode 50 as a mask. If passivated doped regions 2021 are formed at the location of the second patterns 202 after the second ion implantation process in step 5, then in this step 6, after the third ion implantation process is performed, lightly doped regions 2011 are formed at the location of the first patterns 201. If lightly doped regions 2011 are formed at the location of the second patterns 202 after the second ion implantation process, then in this step 6, after the third ion implantation process is performed, passivated doped regions 2021 is formed at the location of the first patterns 201.

Furthermore, the implantation depth of ions is related to energy (kinetic energy) of ions, and further, the energy is proportionate to the applied acceleration voltage, and thus, for example, upon the first ion implantation process, if the implanted ions are boron ions, then the energy of the boron ions is about 40 KeV, and the dosage is about $1E15/cm^3$, and if the implanted ions are phosphorus ions, then the energy of the phosphorus ions is about 60 KeV, and the dosage is about 1E15/cm³. Upon the second or third ion implantation process, if the implanted doping ions for passivation are for example nitrogen ions or nitrogen-gas ions ($N^+$ or $N_2^+$), then the energy of the nitrogen ions or nitrogen-gas ions is about 50 KeV, and the implantation dosage is about 2E15/cm³.

Step 7, after the forgoing steps are completed and an annealing treatment is conducted, a protection layer 60 as well as a source electrode 701 and a drain electrode 702 is formed on the substrate.

Here, upon ion implantation, damages may occur as a result of broken lattice of the active layer, and therefore the semiconductor parameters such as mobility, lifetime, and the like are affected, and most of the ions are not located in replacement positions when they are implanted. Thus, in order to activate the implanted ions and restore mobility and other material parameters, the semiconductor is usually annealed for a proper time period and at a temperature.

Two methods of high-temperature furnace annealing or fast thermal annealing (RTA) can be used for the annealing. If a high-temperature furnace annealing method is employed, its temperature range is set as 400 to 550° C., and the baking time is in the range of 1-4 hours. Where the implanted ions are boron ions, it can be elected to bake at 450° C. for 4 hours, and where the implanted ions are phosphorus ions, it can be elected to bake at 550° C. for 4 hours. If an RTA method is employed, its temperature range is set as 550 to 600° C., and the treatment time is in the range of 20 to 200 seconds. Whichever the implanted ions are of boron ions and phosphorus ions, it can be elected to perform a treatment at 600° C. for 60 seconds.

In view of the fact that passivating ions in the passivated doped regions can suppress the diffusion rate of ions in the heavily doped regions, formation of the passivated doped regions 2021 or the lightly doped regions 2011 at the location of the second patterns 202 is for example that: framing the passivated doped regions 2021 at the location of the second patterns 202; and accordingly, formation of the lightly doped regions 2011 or the passivated doped regions 2021 at the location of the first patterns 201 is that: forming the lightly doped regions 2011 at the location of the first patterns 201.

Figure 13:
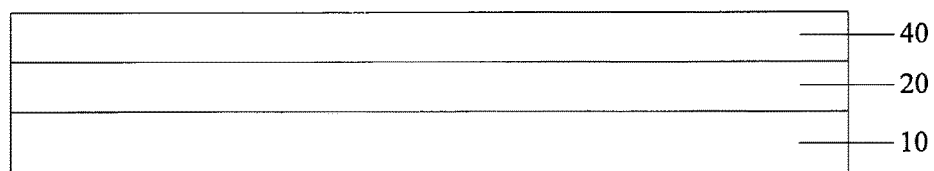
FIGS. 13 to 19 are schematic view illustrating a process of manufacturing a polysilicon thin film transistor provided by an embodiment of the invention.

According to an embodiment of the invention, there is provided a manufacturing method of a polysilicon thin film transistor, comprising the following steps:

S10, amorphous silicon is deposited on a substrate 10 and subjected to a polycrystallization treatment so as to form a polysilicon layer 20 illustrated in FIG. 13, and photoresist 40 is formed on the polysilicon layer.

It is to be noted here that, formation of the photoresist 40 on the polysilicon layer may be conducted by way of coating, deposition, or the like.

For example, it is possible that an amorphous silicon layer is deposited on a substrate by way of PECVD and is subjected to a dehydrogenation process with a high-temperature oven. After completion of the dehydrogenation process, an LTPS manufacturing process is conducted, in which a crystallization process such as a laser annealing process, a metal induced crystallization process, a solid-phase crystallization process or the like is used to conduct a crystallization treatment on the amorphous silicon layer so as to form a polysilicon layer 20 on the substrate. Next, a layer of photoresist 40 is coated on the polysilicon layer.

Figure 14:
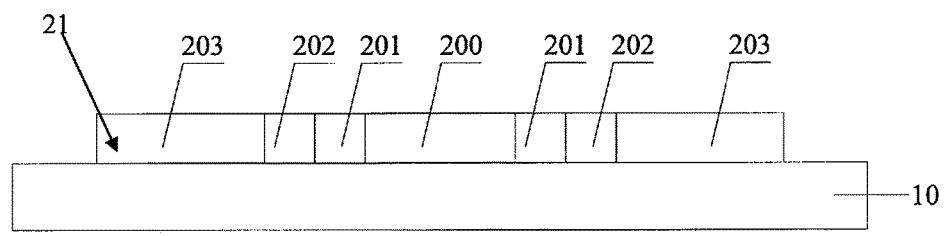

S11, by one patterning process treatment, an active layer illustrated in FIG. 14 is formed on the substrate. The active layer 21 comprises a channel area 200, first patterns 201 located on two sides of the channel area, second patterns 202 located on the sides of the first patterns away from the channel area, and third patterns 203 located on the sides of the second patterns away from the first patterns.

Figure 15:
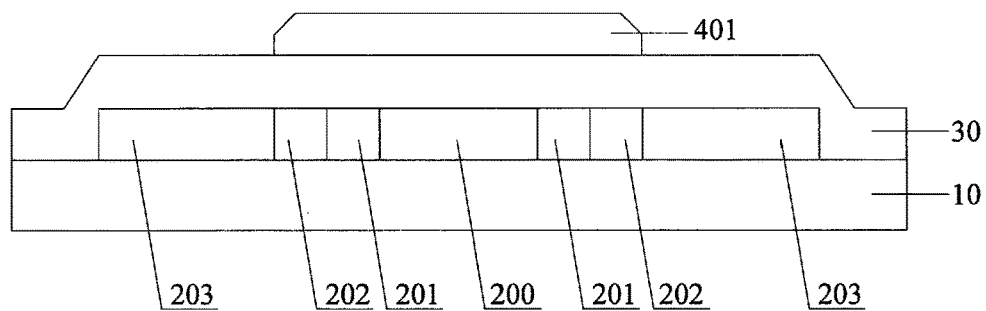

S12, as illustrated in FIG. 15, a gate insulating layer 30 is formed on the basis of the forgoing steps, and a first photoresist pattern 401 exactly corresponding to the channel area 200, the first patterns 201, and the second patterns 202 is formed on the gate insulating layer 30.

It is considered that the thickness of the gate insulating layer 30 may affect the amount of energy necessary for subsequent implantation of ions, and hence in this step, the thickness of the gate insulating layer 30 may be in the range of 800 Å to 1000 Å.

Figure 16:
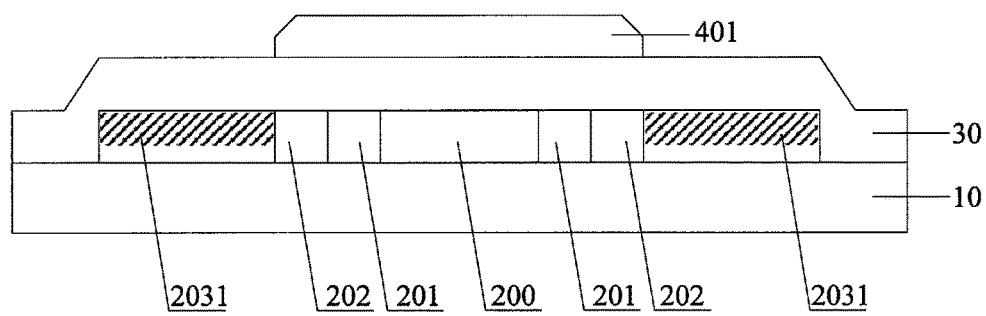

S13, through one ion implantation process, heavily doped regions 2031 illustrated in FIG. 16 is formed at the location of the third patterns 203.

The heavily doped regions 2031 may be of P type, or may be of N type. In the case of P type, the implanted ions may be for example boron ions, and in case of N type, the implanted ions may be for example phosphorus ions.

Furthermore, the implantation depth of ions is related to the energy of the ions, and thus in this step, if the implanted ions are boron ions, then for example, the energy of boron ions may be selected as 40 KeV, and the dosage thereof may be selected as 1E15/cm³; and if the implanted ions are phosphorus ions, then for example, the energy of phosphorus ions may be 60 KeV, and the dosage thereof may be about 1E15/cm³.

Figure 17:
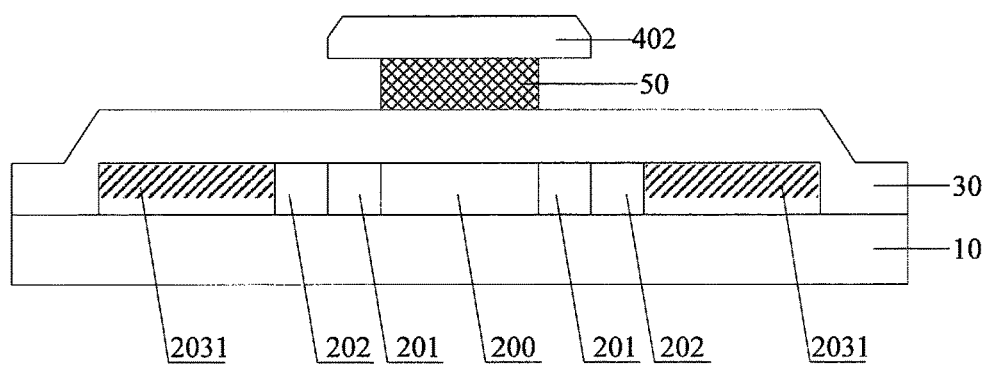

S14, after the photoresist at the location of the first photoresist pattern 401 is removed, a metal layer and a layer of photoresist are formed on the substrate in sequence, and after the photoresist is subjected to exposure and development and the metal layer is etched, a gate electrode 50 illustrated in FIG. 17 and a second photoresist pattern 402 located on the gate electrode are formed, and the second photoresist pattern 402 exactly corresponds to the channel area 200 and the first patterns 201.

The etching here is wet etching. After etching, the gap between an edge of the gate electrode 50 and an edge of the second photoresist pattern 402 exactly corresponds to a first pattern 201.

Figure 18:
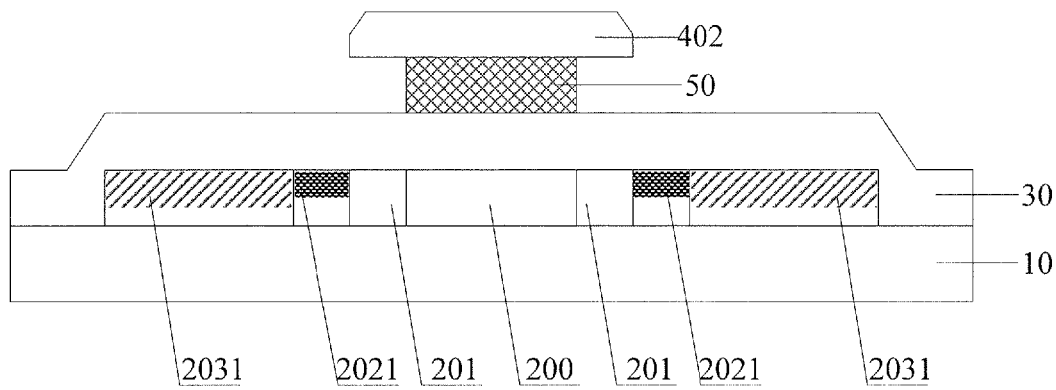

S15, by one ion implantation process, passivated doped regions 2021 illustrated in FIG. 18 are formed at the location of the second patterns 202; doping ions for passivation that form stable covalent bonds with silicon atoms are included in the passivated doped regions 2021. Moreover, the implantation depth of the doping ions for passivation in the passivated doped regions 2021 is smaller than the implantation depth of ions in the heavily doped regions 2031, and the dosage is greater than dosage of the ions in the heavily doped regions 2031.

Doping ions for passivation that can form stable covalent bonds with silicon atoms are such as nitrogen ions ($N^+$) or nitrogen gas ions ($N_2^+$). Here, as for nitrogen ions or nitrogen gas ions, the energy for implantation may be, for example, selected as 50 KeV, and the implantation dosage may be selected as 2E15/cm³.

In the step S15, on the one hand, nitrogen ions or nitrogen gas ions can form Si—N bonds with Si atoms, so that boundary defects and defect states in polysilicon are repaired; on the other hand, after the doped ions for passivation at a high concentration diffuse, the diffusion rate of the ions in the heavily doped regions can be suppressed; on still another hand, because the implantation depth of doping ions for passivation in the passivated doped regions 2021 is smaller than the implantation depth of ions in the heavily doped regions 2031, ions (such as boron ions or phosphorus ions) in the heavily doped regions 2031 can be suppressed from diffusing toward the direction of the gate insulating layer and leaving.

It is to be noted that, in embodiment of the invention, the implantation depth is a distance with one surface of the polysilicon layer 20 away from the substrate 10 as a reference, namely, a distance with the interface between the polysilicon layer 20 and the gate insulating layer 30 as a reference. If it is near the reference face, then the depth is shallow; and if it is far from the reference source, then the depth is deep.

Figure 19:
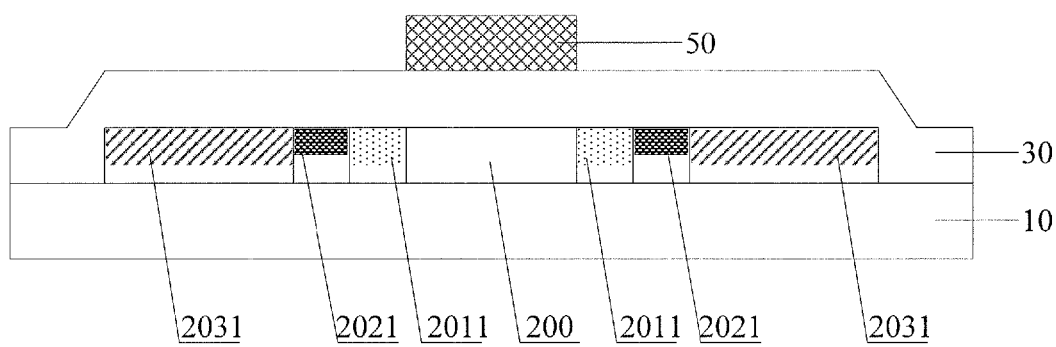

S16, after the photoresist at the location of the second photoresist pattern 402 is removed, by one ion implantation process, lightly doped regions 2011 illustrated in FIG. 19 are formed at the location of the first patterns 201. The implantation depth of ions in the lightly doped regions 2011 is greater than the implantation depth of the doping ions for passivation in the passivated doped regions 2021.

The implantation dosage of ions in the lightly doped regions 2011 is smaller than the implantation dosage of ions in the heavily doped regions 2031, and no limitation will be required.

The lightly doped regions 2011 that can suppress the leakage current is formed in this step S16. Furthermore, due to the act of the passivated doped regions 2021, the diffusion rate of the ions in the lightly doped regions 2011 can be suppressed. As can be understood from the fact that implantation depth of the doping ions for passivation in the passivated doped regions 2021 is smaller than the implantation depth of ions in the lightly doped regions 2011, the diffusion of ions (such as boron ions or phosphorus ions) in the lightly doped regions 2011 toward the direction of the gate insulating layer 30 and leaving can be alleviated, so that the performance of TFTs become more stable.

S17, after the forgoing steps are completed and an annealing treatment is conducted, a protection layer 60, a source electrode 701 and a drain electrode 702 illustrated in FIG. 8 are further formed.

With an annealing treatment, it is possible that damages of lattice upon ion implantation are repaired and mobility and other parameters are restored, and moreover, the implanted ions are located in the replacement positions of the lattice.

An RTA mode may be used for the annealing, its temperature range is set as 550 to 600° C., and the treatment time is in the range of 20 to 200 seconds. Whichever the implanted ions are of boron ions and phosphorus ions, it can be elected to conduct the treatment at 600° C. for 60 seconds.

According to an embodiment of the invention, there is provided a manufacturing method of a polysilicon thin film transistor, comprising: forming a channel area 200, first patterns 201 located on two sides of the channel area, second patterns 202 located on the sides of the first patterns away from the channel area, and third patterns 203 located on the sides of the second patterns away from the first patterns; and forming a heavily doped regions 2031 at the location of the third patterns 203, passivated doped regions 2021 or lightly doped regions 2011 at the location of the second patterns 202, and the lightly doped regions 2011 or the passivated doped regions 2021 at the location of the first patterns 201 accordingly, by a doping process; the implantation depth of the doping ions for passivation in the passivated doped regions 2021 is smaller than the implantation depth of ions in the heavily doped regions 2031 and the lightly doped regions 2011, and the dosage of the implanted ions is greater than dosage of the implanted ions in the heavily doped regions 2031.

On one hand, as the doping ions for passivation that can form stable covalent bonds with silicon atoms are included in the passivated doped regions 2021, boundary defects and defect states in polysilicon can be repaired; on the other hand, after the doped ions for passivation at a high concentration diffuse, the diffusion rate of the ions in the heavily doped regions 2031 and the lightly doped regions 2011 can be suppressed. Thereby, the hot carrier effect is effectively suppressed. In turn, this causes TFTs to present a more stable performance. Furthermore, because the implantation depth of doping ions for passivation in the passivated doped regions is smaller than the implantation depth of ions in the heavily doped regions and the lightly doped regions, ions (such as boron ions or phosphorus ions) in these two regions can be suppressed from diffusing toward the direction of a gate insulating layer and leaving.

Figure 9:
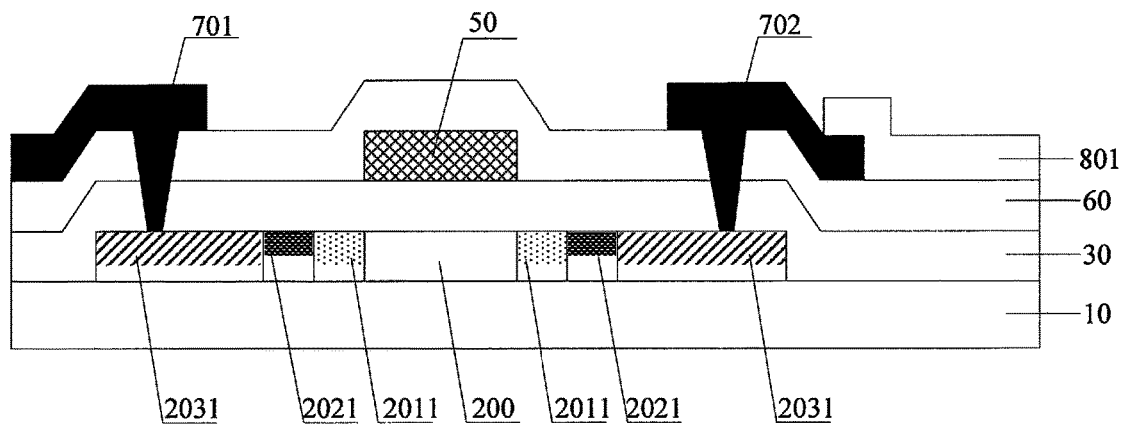
FIG. 9 is a structurally schematic view illustrating an array substrate provided by an embodiment of the invention.

From the manufacturing method of an array substrate with the polysilicon thin film transistor fabricated by the above method, on the basis of completion of the thin film transistor fabricated by the above steps S10 to S17, the method further comprises: forming a pixel electrode 801 electrically connected to the drain electrode as illustrated in FIG. 9 on the substrate. In the manufacturing process of the array substrate, the method further involves forming a gate line and a gate pad electrically connected to the gate electrode, a data line electrically and a data pad connected to the source electrode, and so on, and details being omitted here.

Further, preferably, for example, before the channel area 200, the first patterns 201 located on two sides of the channel area, the second patterns 202 located on the sides of the first patterns away from the channel area, and the third patterns 203 located on the sides of the second patterns away from the first patterns are formed on the substrate, the manufacturing method of the array substrate further comprises: forming a buffer layer 90 illustrated in FIG. 10 on the substrate. In this way, harmful substances (such as alkali metal ions) in the glass substrate can be prevented from affecting properties of the polysilicon layer.

In addition, the array substrate fabricated by the method provided by an embodiment of the invention is adaptable for manufacturing liquid crystal display devices of an advanced super dimension switch (ADS) mode, an In-plane switching (IPS) mode, an organic electroluminescence display (OELD) mode and the like.

The operation mechanism of an LCD of ADS mode is that, a multi-dimensional electric field is formed by an electric field produced at edges of slit electrodes on the same plane and an electric field produced between a layer of the slit electrodes and a layer of a plate-like electrode, so as to allow liquid crystal molecules at all alignment within a liquid crystal cell, which are located over the electrode and between the slit electrodes, to be rotated, and thereby the work efficiency of liquid crystals is enhanced and the transmissive efficiency is increased. The ADS technology can improve the picture quality of thin film transistor liquid crystal display (TFT-LCD) products, and has advantages such as high resolution, high transmissivity, low power consumption, wide viewing angle, high aperture ratio, low chromatic aberration, push Mura-free, etc. An OLED has a characteristic such as self-illumination and has such merits as large visual angle, notable save of electrical energy, and so on.

For example, as for an ADS mode array substrate, the manufacturing method of the array substrate further comprises: forming a common electrode 802 as illustrated in FIG. 11 or FIG. 12. However, the common electrode may also be formed below the pixel electrode 801.

For example, as for an IPS mode array substrate, the manufacturing method of the array substrate further comprises: at the same time when a pixel electrode 801 electrically connected to the drain electrode 702 is formed, a common electrode is forming as well.

For example, as for an array substrate for an OLED display device, an organic light emitting diode is subsequently formed on the formed pixel electrode 801, the pixel electrode 801 may be function as a cathode or an anode of the organic light emitting diode, and the organic light emitting diode comprises an organic light emitting layer.

Descriptions made above are merely exemplary embodiments of the invention, but are not used to limit the protection scope of the invention. The protection scope of the invention is determined by attached claims.

The invention claimed is:

1. A polysilicon thin film transistor, comprising a gate electrode, a source electrode, a drain electrode and an active layer, wherein
   the active layer comprises at least a channel area, first doped regions, second doped regions and heavily doped regions, the first doped regions are disposed on two sides of the channel area, the second doped regions are disposed on sides of the first doped regions away from the channel area, and the heavily doped regions are disposed on sides of the second doped regions-opposed to the first doped regions; and
   a concentration of ions in the heavily doped regions is between a concentration of the ions in the first doped regions and that in the second doped regions, upper surfaces of the first doped regions, upper surfaces of the second doped regions and upper surfaces of the heavily doped regions are coplanar with an entire upper surface of the active layer, and the entire upper surface of the active layer is planar.

2. The polysilicon thin film transistor claimed as claim 1, wherein the first doped regions are passivated doped regions, and the second doped regions are lightly doped regions; and
   as for ions in the passivated doped regions, an implantation depth thereof is smaller than an implantation depth of ions in the heavily doped regions and the lightly doped regions, and a dosage thereof is greater than a dosage of ions in the heavily doped regions.

3. The polysilicon thin film transistor claimed as claim 1, wherein the first doped regions are lightly doped regions, and the second doped regions are passivated doped regions; and
   as for ions in the passivated doped regions, an implantation depth thereof is smaller than an implantation depth of ions in the heavily doped regions and the lightly doped regions, and a dosage thereof is greater than a dosage of ions in the heavily doped regions.

4. The polysilicon thin film transistor claimed as claim 2, wherein doping ions for passivation that form stable covalent bonds with silicon atoms are included in the passivated doped region; and the heavily doped regions is of P type or of N type.

5. The polysilicon thin film transistor claimed as claim 3, wherein doping ions for passivation that form stable covalent bonds with silicon atoms are included in the passivated doped region; and the heavily doped regions is of P type or of N type.

6. An array substrate, comprising the polysilicon thin film transistor claimed as claim 1.

7. The array substrate claimed as claim 6, further comprising a buffer layer, wherein the polysilicon thin film transistor is formed on the buffer layer.

8. The array substrate claimed as claim 6, further comprising a common electrode.

9. The array substrate claimed as claim 7, further comprising a common electrode.

10. A polysilicon thin film transistor, comprising a gate electrode, a source electrode, a drain electrode, an active layer and a gate insulating layer covering the active layer, wherein
    the active layer comprises at least a channel area, first doped regions, second doped regions and heavily doped regions, the first doped regions are disposed on two sides of the channel area, the second doped regions are disposed on sides of the first doped regions away from the channel area, and the heavily doped regions are disposed on sides of the second doped regions-opposed to the first doped regions;
    a concentration of ions in the heavily doped regions is between a concentration of the ions in the first doped regions and that in the second doped regions; and
    both the source electrode and the drain electrode are on a side, away from the active layer, of the gate insulating layer and in direct contact with the heavily doped regions, respectively.

* * * * *